(12) United States Patent
Higashijima

(10) Patent No.: US 8,905,051 B2
(45) Date of Patent: Dec. 9, 2014

(54) LIQUID PROCESSING APPARATUS AND LIQUID PROCESSING METHOD

(75) Inventor: Jiro Higashijima, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 190 days.

(21) Appl. No.: 13/495,111

(22) Filed: Jun. 13, 2012

(65) Prior Publication Data

US 2012/0318301 A1 Dec. 20, 2012

(30) Foreign Application Priority Data

Jun. 15, 2011 (JP) ................................. 2011-133189

(51) Int. Cl.
*B08B 3/04* (2006.01)
*H01L 21/67* (2006.01)

(52) U.S. Cl.
CPC ................................ *H01L 21/6719* (2013.01)
USPC ........ 134/104.1; 134/95.2; 134/95.1; 134/26; 134/33; 134/137; 118/715; 118/730; 118/52

(58) Field of Classification Search
CPC ................... H01L 21/67051; H01L 21/67028; H01L 21/67034; H01L 37/3244; G03F 7/3021
USPC .......... 134/95.2, 715, 95.1, 730, 26; 118/715, 118/730, 66
See application file for complete search history.

(56) References Cited

U.S. PATENT DOCUMENTS

| | | | |
|---|---|---|---|
| 6,692,165 B2 * | 2/2004 | Tanaka et al. ................ | 396/611 |
| 2006/0086373 A1 * | 4/2006 | Park ................................ | 134/6 |

FOREIGN PATENT DOCUMENTS

| | | | |
|---|---|---|---|
| JP | 03-045631 A | | 4/1991 |
| JP | 08-299929 A | | 11/1996 |
| JP | 2000-061377 A | | 2/2000 |
| JP | 2003-031538 A | | 1/2003 |
| JP | 2009-094525 A | | 4/2009 |
| JP | 2009-141280 A | | 6/2009 |
| JP | 2009141280 A | * | 6/2009 |
| JP | 2010-177424 A | | 8/2010 |
| WO | 2007-132609 A | | 11/2007 |

OTHER PUBLICATIONS

Ito, Kiko, "Substrate Processing Equipment, Method for Processing Substrate, and Storage Medium", JP 2009-141280, Machine Translation.*

* cited by examiner

*Primary Examiner* — Michael Barr
*Assistant Examiner* — Thomas Bucci
(74) *Attorney, Agent, or Firm* — Abelman, Frayne & Schwab

(57) ABSTRACT

Disclosed are a liquid processing apparatus and a liquid processing method that can prevent a substrate in a processing chamber from being contaminated due to contaminants attached to a nozzle supporting arm. The liquid processing apparatus includes a processing chamber in which a substrate holder holding a substrate and a cup disposed around the substrate holder are provided; a nozzle configured to supply a fluid to the substrate held by the substrate holder; and a nozzle supporting arm configured to support the nozzle. A gas ejection mechanism is installed at the nozzle supporting arm to eject a gas toward a front end surface of the nozzle supporting arm.

10 Claims, 9 Drawing Sheets

LIQUID PROCESSING APPARATUS AND LIQUID PROCESSING METHOD

CROSS-REFERENCE TO RELATED APPLICATIONS

This application is based on and claims priority from Japanese Patent Application No. 2011-133189, filed on Jun. 15, 2011, with the Japanese Patent Office, the disclosure of which is incorporated herein in its entirety by reference.

TECHNICAL FIELD

The present disclosure relates to a liquid processing apparatus and a liquid processing method for a liquid-processing of a substrate such as cleaning, etching, plating and developing by supplying a processing liquid to the substrate while holding and rotating the substrate in a horizontal state.

BACKGROUND

In the related art, various types of liquid processing apparatus have been known which perform a liquid-processing of a substrate ("wafer") such as cleaning, etching, plating and developing of the substrate by supplying a processing liquid to a front surface or a back surface of the substrate while holding and rotating the substrate in a horizontal state. See, for example, Japanese Patent Application Laid-Open No. 2009-94525 which discloses a single type liquid processing apparatus that processes substrates one by one. That is, a substrate is rotated while being held in a horizontal state by a spin chuck, and a processing liquid is supplied to the surface of the substrate while being held and rotated by the spin chuck. In the single type liquid processing apparatus, a technology has been known in which a fan filter unit ("FFU") is installed above a processing chamber and a gas such as nitrogen ($N_2$) gas or clean air is sent from the FFU into the processing chamber in a down-flow mode.

SUMMARY

An exemplary embodiment of the present disclosure provides a liquid processing apparatus, including: a processing chamber provided with a substrate holder configured to hold a substrate and a cup disposed around the substrate holder; a nozzle configured to supply a fluid to the substrate held by the substrate holder; a nozzle supporting arm configured to support the nozzle; and a gas ejection mechanism attached to the nozzle supporting arm and configured to eject a gas toward a surface of a front end portion of the nozzle supporting arm.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
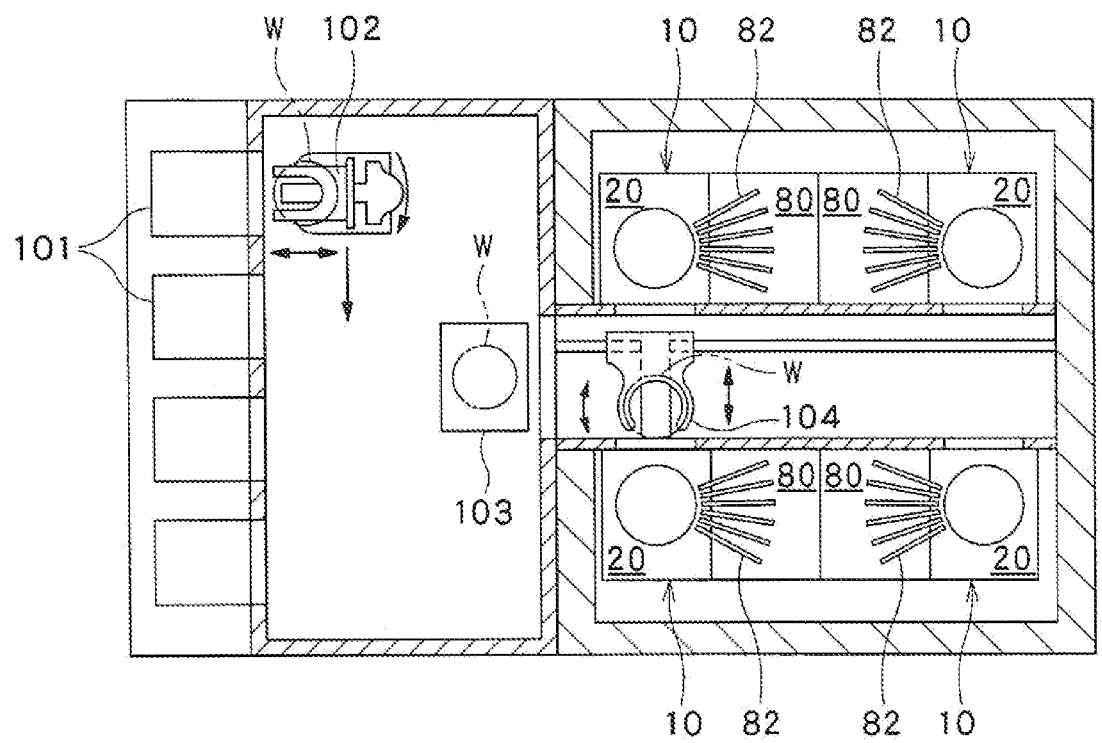
FIG. 1 is a top plan view of a liquid processing system including a liquid processing apparatus according to an exemplary embodiment of the present disclosure.

In the following detailed description, reference is made to the accompanying drawing, which form a part hereof. The illustrative embodiments described in the detailed description, drawing, and claims are not meant to be limiting. Other embodiments may be utilized, and other changes may be made, without departing from the spirit or scope of the subject matter presented here.

In the liquid processing apparatus in the related art as illustrated in Japanese Patent Application Laid-Open No. 2009-94525, an arm that supports a nozzle or an arm support part that supports the arm is installed in a processing chamber. Here, in the liquid processing apparatus, contaminants attached to the arm may fall on to be attached to a wafer W in the processing chamber. If a chemical liquid is scattered and attached to the arm while wafer W is being subjected to a liquid processing in the processing chamber, the chemical liquid remains on the arm. As a result, the atmosphere with the remaining chemical liquid may cause a negative influence on a subsequent wafer W processing, for example, contaminating wafer W.

The present disclosure has been made in an effort to provide a liquid processing apparatus and a liquid processing method that can prevent a substrate in a processing chamber from being contaminated due to contaminants attached to a nozzle supporting arm.

An exemplary embodiment of the present disclosure provides a liquid processing apparatus, including: a processing chamber provided with a substrate holding unit configured to hold a substrate and a cup disposed around the substrate holding unit; a nozzle configured to supply a fluid to the substrate held by the substrate holding unit; a nozzle supporting arm configured to support the nozzle; and a gas ejection mechanism attached to the nozzle supporting arm and configured to eject a gas toward a surface of a front end portion of the nozzle supporting arm.

In the liquid processing apparatus, the gas ejection mechanism includes a protrusion protruding from the front end surface of the nozzle supporting arm and a gas supply tube installed within the nozzle supporting arm, the protrusion has a gas ejection hole, and the gas supply tube is configured to supply a gas to the protrusion.

Further, two or more gas ejection holes of the protrusion are installed to eject the gas in two or more different directions.

Further, the nozzle is located at the side surface of the nozzle supporting arm, and a processing liquid supply pip is installed within the nozzle supporting arm.

The liquid processing apparatus further includes an arm standby chamber, an arm driving mechanism configured to move the nozzle supporting arm in the arm standby chamber; and the nozzle supporting arm is moved by the arm driving mechanism between an advance position where the nozzle is inside of the processing chamber and a retreat position where the nozzle is outside of the processing chamber.

The liquid processing apparatus further includes an arm cleaning unit configured to clean the nozzle supporting arm, and installed in a region between the cup and the arm standby chamber in the processing chamber, or at the arm standby chamber to be fixed.

In the liquid processing apparatus, a wall extending in a vertical direction is installed between the processing chamber and the arm standby chamber, an opening through which the nozzle supporting arm passes is formed in the wall, and the arm cleaning unit is attached to the wall.

Further, the arm cleaning unit further includes a suction mechanism configured to absorb a liquid, and the gas ejection mechanism ejects the gas in the vicinity of the suction mechanism.

Still further, when the nozzle supporting arm is located at the retreat position, the opening of the wall is closed by the surface of the front end portion of the nozzle supporting arm.

The liquid processing apparatus further includes a cylindrical outside cup peripheral case disposed around the cup in the processing chamber, adapted to be elevatable/descendible between an upper position and a lower position, and having an opening through which the nozzle supporting arm passes, and the arm cleaning unit is installed outside the outside cup peripheral case.

The liquid processing apparatus further includes a cleaning unit for the outside cup peripheral case positioned below the outside cup peripheral case in the processing chamber and having a storage part for storing cleaning liquid for cleaning the outside cup peripheral case positioned between the wall and the cup.

A second exemplary embodiment of the present disclosure provides a liquid processing method, including: holding a substrate by a substrate holding unit provided within a processing chamber; advancing a nozzle supporting arm supporting a nozzle into the processing chamber; supplying a fluid to the substrate held by the substrate holding unit by a nozzle of the nozzle supporting arm having advanced into the processing chamber; and ejecting a gas toward a surface of a front end portion of the nozzle supporting arm by a gas ejection mechanism attached to the nozzle supporting arm.

In the liquid processing method, the ejecting of the gas toward the surface of the front end portion of the nozzle supporting arm by the gas ejection mechanism installed at the nozzle supporting arm is performed when the nozzle supporting arm is located at a retreat position where the nozzle has retreated from the processing chamber.

Further, the ejecting of the gas toward the surface of the front end portion of the nozzle supporting arm is performed when the outside cup peripheral case installed around the cup in the processing chamber is located at the upper position.

The liquid processing method further includes cleaning the nozzle supporting arm by an arm cleaning unit during the nozzle supporting arm moves from an advance position where the nozzle is inside of the processing chamber to the retreat position, and the ejecting of the gas toward the surface of the front end portion of the nozzle supporting arm by the gas ejection mechanism installed at the nozzle supporting arm is performed after the nozzle supporting arm is cleaned by the arm cleaning unit.

According to the exemplary embodiments of the present disclosure, it is possible to prevent a substrate in a processing chamber from being contaminated due to contaminants attached to a front end surface of a nozzle supporting arm.

Figure 2:
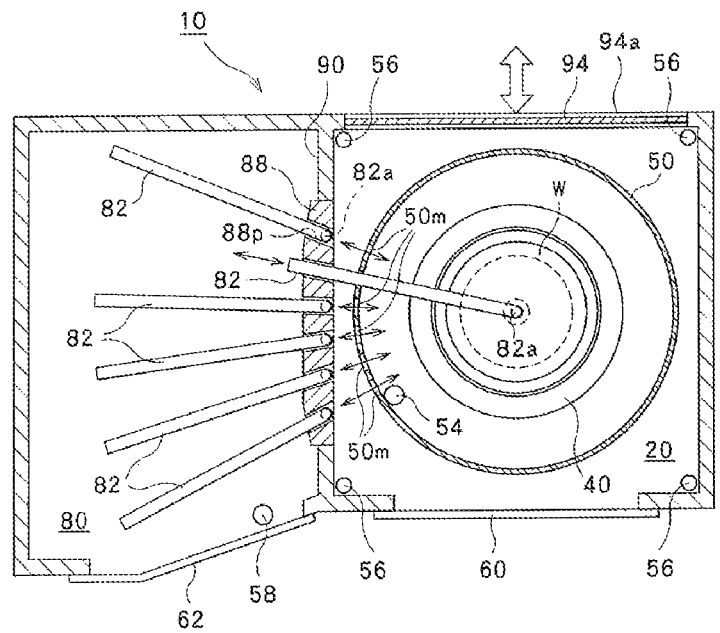
FIG. 2 is a plan view schematically illustrating a configuration of the liquid processing apparatus according to the exemplary embodiment of the present disclosure.
Figure 3:
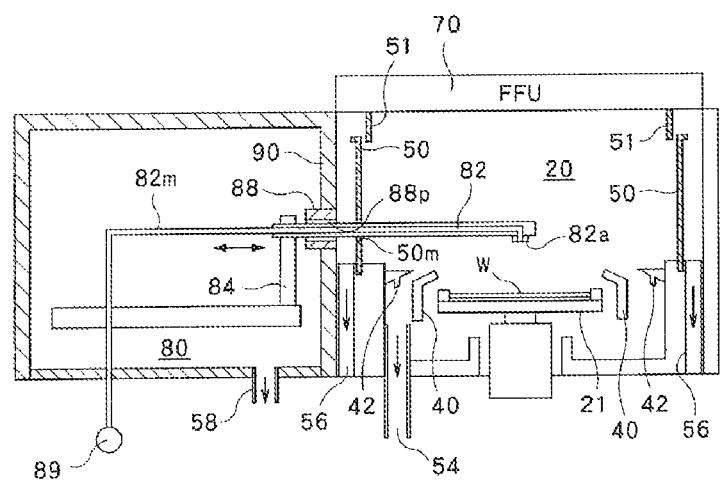
FIG. 3 is a side view of the liquid processing apparatus illustrated in FIG. 2.
Figure 4:
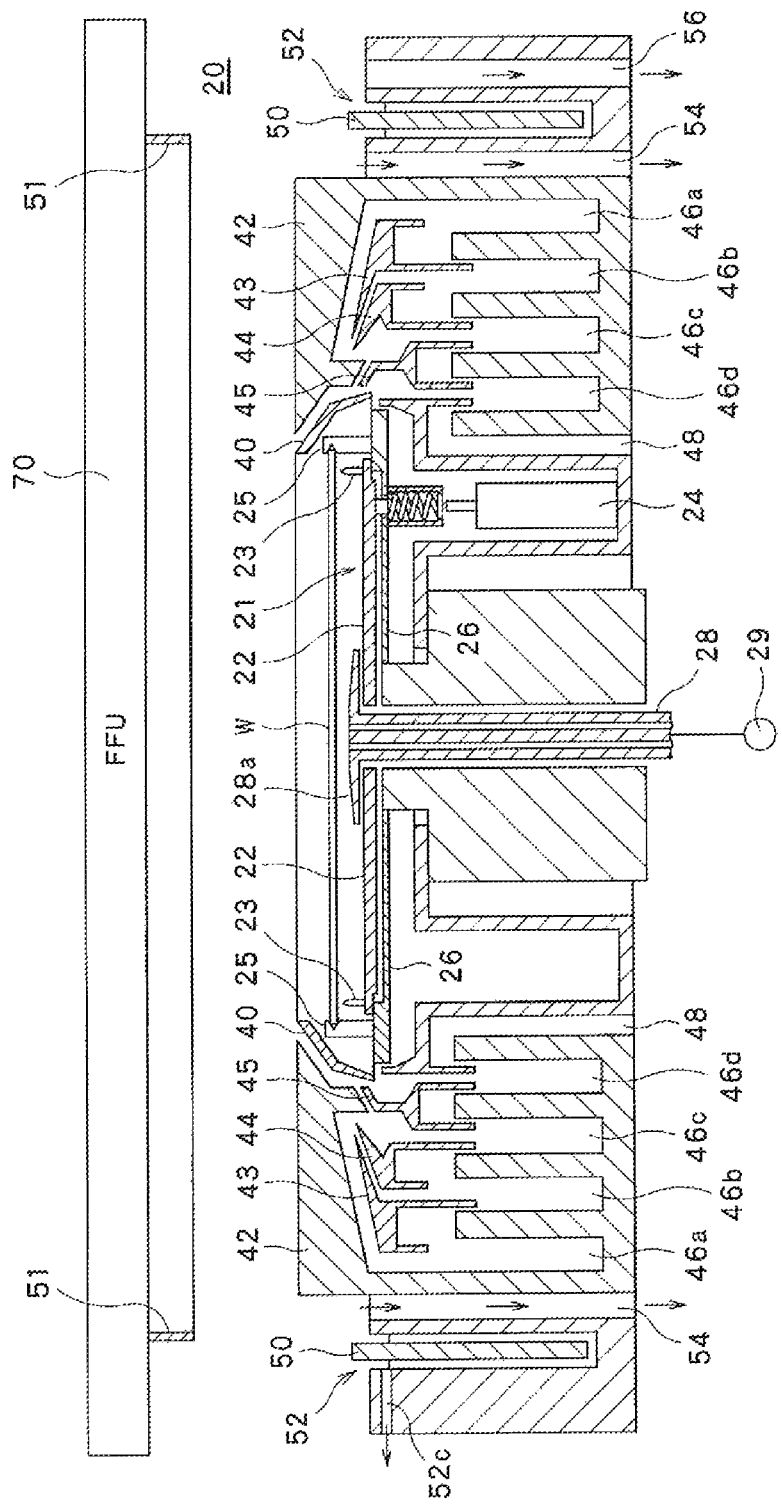
FIG. 4 is a longitudinal cross-sectional view illustrating the detailed configuration of the liquid processing apparatus illustrated in FIG. 2 for a case when the outside cup peripheral case is located at a lower position.
Figure 5:
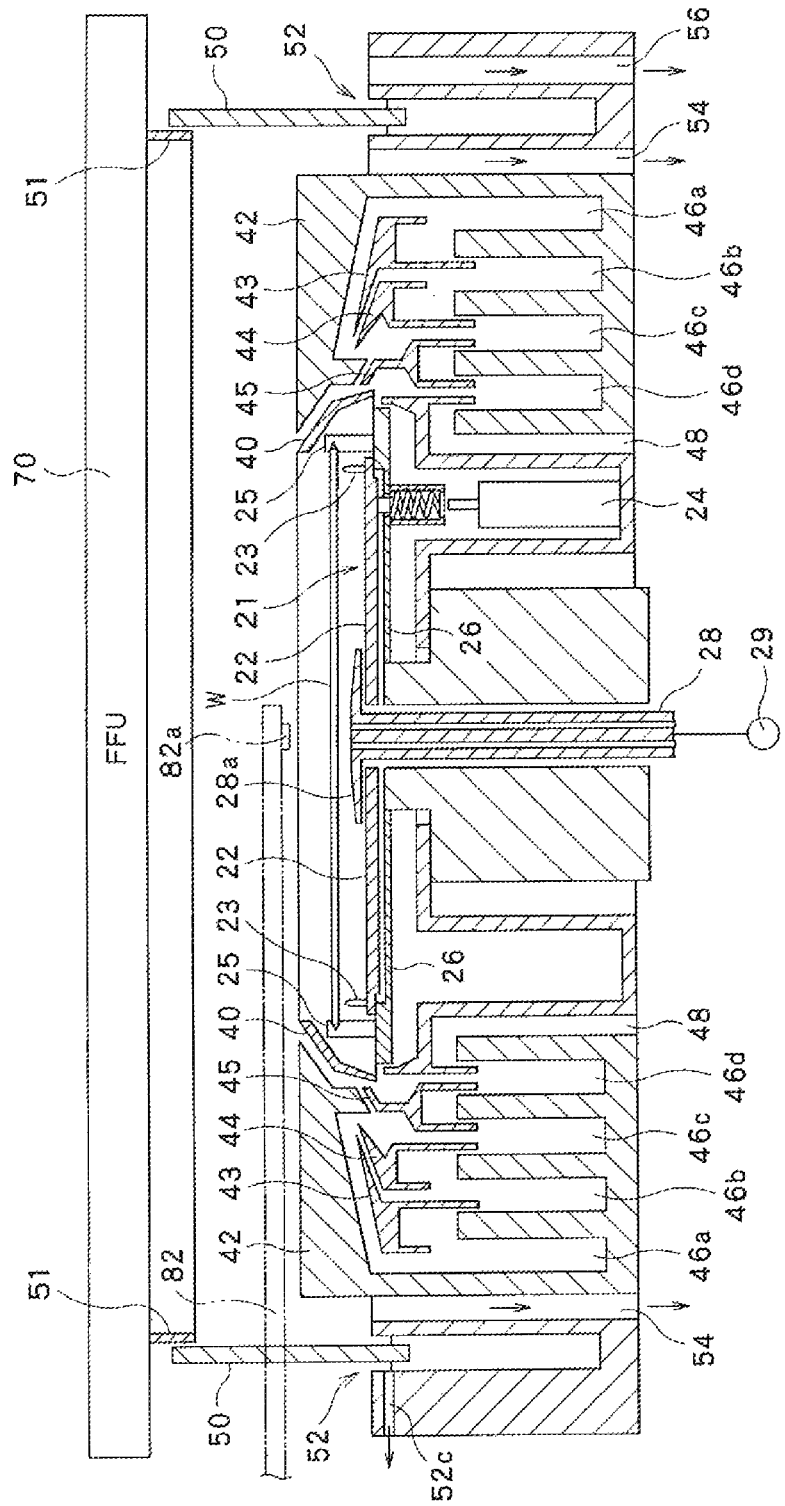
FIG. 5 is a longitudinal cross-sectional view illustrating the detailed configuration of the liquid processing apparatus as illustrated in FIG. 2 for a case when the outside cup peripheral case is located at an upper position.
Figure 6:
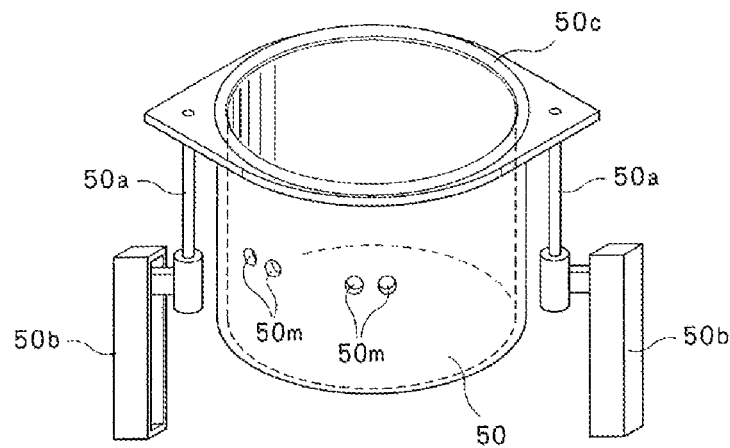
FIG. 6 is a perspective view illustrating a configuration of the outside cup peripheral case in the liquid processing apparatus as illustrated in, for example, FIG. 4.

Hereinafter, exemplary embodiments of the present disclosure will be described with reference to the accompanying drawings. FIG. 1 to FIG. 11 are views illustrating a liquid processing apparatus according to an exemplary embodiment of the present disclosure. More specifically, FIG. 1 is a top plan view of a liquid processing system including a liquid processing apparatus according to the exemplary embodiment of the present disclosure. FIG. 2 is a plan view schematically illustrating the configuration of the liquid processing apparatus according to the exemplary embodiment, and FIG. 3 is a side view schematically illustrating the configuration of the liquid processing apparatus illustrated in FIG. 2. FIGS. 4 and 5 are longitudinal cross-sectional views illustrating the detailed configuration of the liquid processing apparatus illustrated in FIG. 2. FIG. 6 is a perspective view illustrating the configuration of an outside cup peripheral case in the liquid processing apparatus as illustrated in, for example, FIG. 4. FIG. 7 to FIG. 11 are views illustrating the configuration of nozzle supporting arms which are installed in the liquid processing apparatus as illustrated in, for example, FIG. 2.

First, a liquid processing system including a liquid processing apparatus according to the exemplary embodiment of the present disclosure will be described with reference to FIG. 1. As illustrated in FIG. 1, the liquid processing system includes a placing table 101 for placing a carrier accommodating a substrate W (hereinafter, referred to as a wafer W) such as a semiconductor wafer that is a substrate to be processed from the outside, a transfer arm 102 for taking out wafer W accommodated in the carrier, a rack unit 103 for placing wafer W taken out by transfer arm 102, and a transfer arm 104 receiving wafer W placed on rack unit 103 and carrying wafer W into a liquid processing apparatus 10. As illustrated in FIG. 1, in the liquid processing system, a plurality of liquid processing apparatuses 10 (e.g., four in FIG. 1) are installed.

Next, a schematic configuration of the liquid processing apparatus 10 according to the exemplary embodiment of the present disclosure will be described with reference to FIGS. 2 and 3.

As illustrated in FIGS. 2 and 3, liquid processing apparatus 10 according to the exemplary embodiment of the present disclosure includes a processing chamber 20 in which wafer W is accommodated and liquid processing of accommodated wafer W is performed. As illustrated in FIG. 3, a holding unit 21 for holding and rotating wafer W in a horizontal state is installed in processing chamber 20, and a ring-shaped rotational cup 40 is disposed around holding unit 21. As illustrated in FIGS. 2 and 3, a cylindrical outside cup peripheral case 50 is disposed around rotational cup 40 in processing chamber 20. As described below, outside cup peripheral case 50 is configured to be elevatable/descendible according to the processing status of wafer W. The detailed configuration of holding unit 21, rotational cup 40, and outside cup peripheral case 50 will be described below.

In liquid processing apparatus 10, a nozzle 82a for supplying a processing liquid or a fluid such as $N_2$ gas to wafer W from above wafer W held by holding unit 21 and a nozzle supporting arm 82 which supports nozzle 82a are installed. As illustrated in FIG. 2, a plurality of nozzle supporting arms 82 (e.g., six arms) are installed in a single liquid processing apparatus 10, and nozzle 82a is installed in the vicinity of a front end of each of nozzle supporting arms 82. As illustrated in FIG. 3, an arm support part 84 is installed in each of nozzle supporting arms 82 and driven in a horizontal direction in FIG. 3 by an arm driving mechanism 85 which will be described below. By doing this, each of nozzle supporting arms 82 is rectilinearly moved in a horizontal direction between an advance position where nozzle 82a advances into processing chamber 20 and a retreat position where nozzle 82a retreats from processing chamber 20 into an arm standby part, which will be described. See, for example, the arrow indicated on each of nozzle supporting arms 82 in FIGS. 2 and 3. As illustrated in FIG. 3, a surface processing liquid supplying pipe 82m is installed in each of nozzle supporting arms 82 and connected to a surface processing liquid supplier 89. A processing liquid or a fluid such as $N_2$ gas is supplied from surface processing liquid supplier 89 to nozzle 82a of nozzle supporting arm 82 through each of surface processing liquid supplying pipes 82m.

As shown in FIGS. 2 and 3, in liquid processing apparatus 10, an arm standby chamber 80 is installed adjacent to processing chamber 20. Nozzle supporting arm 82 having retreated from processing chamber 20 stands by in arm standby chamber 80. A wall 90 which extends vertically is installed between arm standby chamber 80 and processing chamber 20. Wall 90 includes an arm cleaning unit 88 provided with openings 88p through which each of nozzle supporting arms 82 passes. Each of nozzle supporting arms 82 is cleaned by arm cleaning unit 88. The detailed configuration of arm cleaning unit 88 will be described below.

As illustrated in FIG. 3, a FFU 70 is installed above processing chamber 20, and gas such as $N_2$ gas or clean air is sent from FFU 70 into processing chamber 20 in a down-flow mode. As illustrated in FIGS. 2 and 3, an exhaust unit 54 is installed inside outside cup peripheral case 50 on the bottom of processing chamber 20. In this way, the gas such as clean air is sent from FFU 70 into processing chamber 20 in the down-flow mode and discharged by exhaust unit 54 so as to substitute the atmosphere in processing chamber 20.

As illustrated in FIGS. 2 and 3, an exhaust unit 56 is installed outside cup peripheral case 50 on the bottom of processing chamber 20. An atmosphere outside cup peripheral case 50 in processing chamber 20 may be discharged by exhaust unit 56. Specifically, exhaust unit 56 prevents the atmosphere in arm standby chamber 80 from flowing into outside cup peripheral case 50. Exhaust unit 56 prevents the atmosphere in outside cup peripheral case 50 from flowing to arm standby chamber 80.

As illustrated in FIGS. 2 and 3, an exhaust part 58 is installed on the bottom of arm standby chamber 80. Specifically, it is possible to expel particles generated from an arm driving mechanism 85, which will be described below, for driving each of nozzle supporting arms 82 in arm standby chamber 80 by exhaust part 58.

As illustrated in FIG. 2, maintenance shutters 60 and 62 are installed at entrances of processing chamber 20 and arm standby chamber 80 of liquid processing apparatus 10, respectively. With this configuration, devices in processing chamber 20 or arm standby chamber 80 may be maintained individually.

As illustrated in FIG. 2, an opening 94a for carrying wafer W in processing chamber 20 and carrying out wafer W from processing chamber 20 by transfer arm 104 is formed at a side wall of liquid processing apparatus 10, and a shutter 94 for opening and closing opening 94a is installed in opening 94a.

In liquid processing apparatus 10 illustrated in FIG. 2, an inner region of outside cup peripheral case 50 in processing chamber 20 is under a slightly positive pressure compared to a clean room, while a region of outside of outside cup peripheral case 50 in processing chamber 20 is under a slightly negative pressure compared to the clean room. As a result, in processing chamber 20, the atmospheric pressure of the inner region of outside cup peripheral case 50 becomes larger than that of the outer region of outside cup peripheral case 50.

Next, the detailed configuration of liquid processing apparatus 10 as illustrated in FIGS. 2 and 3 will be described with reference to FIGS. 4 and 5.

As illustrated in FIGS. 4 and 5, holding unit 21 includes a disk-shaped holding plate 26 for holding wafer W and a disk-shaped lift pin plate 22 installed above holding plate 26. Three lift pins 23 for supporting wafer W from below are installed on a top surface of lift pin plate 22 at regular intervals in a circumferential direction. Only two lift pins 23 are illustrated in FIGS. 4 and 5. A piston mechanism 24 is installed on lift pin plate 22 and elevates/descends lift pin plate 22. More specifically, when wafer W is disposed on lift pins 23 or taken out from lift pins 23 by transfer arm 104 as illustrated in, for example, FIG. 1, lift pin plate 22 is moved upward from the position as illustrated in, for example, FIG. 4 by piston mechanism 24 to be located upper position than rotational cup 40. Meanwhile, when wafer W is subjected to liquid-processing in processing chamber 20, lift pin plate 22 is moved to the lower position as illustrated in, for example, FIG. 4 by piston mechanism 24, and thus rotational cup 40 is positioned around wafer W.

Three holding members 25 for supporting wafer W at lateral sides are installed on holding plate 26 at regular intervals in a circumferential direction. Only two support members 25 are illustrated in FIGS. 4 and 5. Each of holding members 25 holds wafer W on lift pins 23 and places wafer W to be slightly spaced apart from lift pins 23 when lift pin plate 22 is moved from the upper position to the lower position as illustrated in FIGS. 4 and 5.

Each of holding members 25 is configured to be movable between a receiving position where wafer W is received and a holding position where wafer W is held, and also operates in association with the elevation of lift pin plate 22. In other words, when lift pin plate 22 is located at the upper position, each of holding member 25 moves to the receiving position, and when lift pin plate 22 is located at the lower position, each of holding members 25 moves to the holding position.

Through holes are formed at the centers of lift pin plate 22 and holding plate 26, respectively, and a processing liquid supplying pipe 28 is installed to pass through the through holes. Processing liquid supplying pipe 28 is connected with a processing liquid supplying unit 29 and supplies a processing liquid such as chemical liquid or deionized water to a back surface of wafer W held by each of holding members 25 of holding plate 26. Processing liquid supplying pipe 28 is moved up in association with lift pin plate 22. A head part 28a is formed at an upper end of processing liquid supplying pipe 28 to close the through hole of lift pin plate 22.

As illustrated in FIGS. 4 and 5, a ring-shaped rotational cup 40 is disposed around holding unit 21. Rotational cup 40 is attached to holding plate 26 and rotated integrally with holding plate 26. More specifically, rotational cup 40 is installed to surround wafer W supported by each of holding members 25 of holding plate 26 at lateral sides and receives the processing liquid which is laterally scattered from wafer W while wafer W is subjected to a liquid processing.

A drain cup 42, a first guide cup 43, a second guide cup 44 and a third guide cup 45 are installed around rotational cup 40 in sequence from an upper side. Drain cup 42 and guide cups 43, 44, and 45 are formed in a ring shape. Here, drain cup 42 is fixed in processing chamber 20. Meanwhile, elevation cylinders (not shown) are connected to guide cups 43, 44, and 45, respectively, and guide cups 43, 44, and 45 are independently elevatable by corresponding elevation cylinders.

As illustrated in FIGS. 4 and 5, a first processing liquid recovering tank 46a, a second processing liquid recovering tank 46b, a third processing liquid recovering tank 46c and a fourth processing liquid recovering tank 46d are installed below drain cup 42 or guide cups 43, 44, and 45, respectively. The processing liquid, which is laterally scattered from wafer W while wafer W is subjected to a liquid processing, is selectively sent to any one of four processing liquid recovering tanks 46a, 46b, 46c, and 46d based on the kind of processing liquid depending on vertical positions of guide cups 43, 44, and 45.

As illustrated in FIGS. 4 and 5, an exhaust unit 48 is installed inside fourth processing liquid recovering tank 46d. An atmosphere around wafer W is discharged by exhaust unit 48 depending on the predetermined vertical positions of guide cups 43, 44, and 45.

In liquid processing apparatus 10 of the exemplary embodiment of the present disclosure, outside cup peripheral case 50 is installed around drain cup 42 or guide cups 43, 44, and 45 in processing chamber 20. Outside cup peripheral case 50 is elevatable between the lower position as illustrated in FIG. 4 and the upper position as illustrated in FIG. 5. When outside cup peripheral case 50 is located at the upper position as illustrated in FIG. 5, the region within outside cup peripheral case 50 is isolated from the outside.

The detailed configuration of outside cup peripheral case 50 will be described with reference to FIG. 6. FIG. 6 is a perspective view illustrating the configuration of outside cup peripheral case 50. As illustrated in FIG. 6, openings 50m through which nozzle supporting arms 82 pass are formed at the side of outside cup peripheral case 50 corresponding to the number of nozzle supporting arms 82, e.g., when the number of nozzle supporting arms 82 is six, six openings 50m are formed. Support members 50a for supporting outside cup peripheral case 50 are connected to the upper portion of outside cup peripheral case 50, and driving mechanisms 50b for elevating support members 50a are installed at support members 50a. Outside cup peripheral case 50 supported by support members 50a is elevated by elevating support members 50a by driving mechanisms 50b.

As illustrated in FIGS. 4 and 5, guide members 51 are attached to FFU 70. A guide member 51 are disposed to be spaced apart inward from outside cup peripheral case 50 with a small distance when outside cup peripheral case 50 is located at the upper position as illustrated in FIG. 5. In liquid processing apparatus 10 of the exemplary embodiment, when outside cup peripheral case 50 is located at the upper position as illustrated in FIG. 5, the atmospheric pressure inside outside cup peripheral case 50 is larger than the atmospheric pressure outside cup peripheral case 50. Therefore, when outside cup peripheral case 50 is located at the upper position, a down-flow gas in processing chamber 20 which is generated by FFU 70 is guided from the inside of outside cup peripheral case 50 to the outside thereof in the vicinity of an upper end of outside cup peripheral case 50 by guide members 51.

As illustrated in FIGS. 4 and 5, a cleaning unit 52 for cleaning outside cup peripheral case 50 is installed in processing chamber 20. Cleaning unit 52 has a storage part 52a for storing cleaning liquid such as deionized water, and the greater part of outside cup peripheral case 50 is immersed in the cleansing liquid which is stored in storage part 52a when outside cup peripheral case 50 is located at the lower position as illustrated in FIG. 4. By doing this, outside cup peripheral case 50 may be cleaned in cleaning unit 52.

When outside cup peripheral case 50 is located at the upper position as illustrated in FIG. 5, a lower portion of outside cup peripheral case 50 is immersed in the cleaning liquid which is stored in storage part 52a. By doing this, when outside cup peripheral case 50 is located at the upper position, water sealing is performed between the cleaning liquid which is stored in storage part 52a and the lower portion of outside cup peripheral case 50, and a gap between an upper portion of outside cup peripheral case 50 and guide member 51 becomes narrower, thereby isolating the region within outside cup peripheral case 50 from the outside.

As illustrated in FIGS. 4 and 5, in processing chamber 20, an exhaust unit 54 for discharging the atmosphere in processing chamber 20 is installed inside cleaning unit 52, and an exhaust unit 56 for discharging the atmosphere in processing chamber 20 is installed outside the cleaning unit 52. By doing this, when outside cup peripheral case 50 is located at the lower position as illustrated in FIG. 4, the overall atmosphere in processing chamber 20 may be discharged by exhaust units 54 and 56. Meanwhile, when outside cup peripheral case 50 is located at the upper position as illustrated in FIG. 5, the region within outside cup peripheral case 50 is isolated from the outside. As a result, the atmosphere inside outside cup peripheral case 50 may be discharged by exhaust unit 54, and the atmosphere outside cup peripheral case 50 may be discharged by exhaust unit 56.

As described above, in the exemplary embodiment of the present disclosure, the plurality of nozzle supporting arms 82 (e.g., six arms) are installed in single liquid processing apparatus 10, and nozzles 82a are installed at the front ends of nozzle arms 82, respectively. Specifically, nozzles 82a supply a first chemical liquid (e.g., acid chemical liquid), a second chemical liquid (e.g., alkaline chemical liquid), deionized water, $N_2$ gas, isopropyl alcohol (IPA), mist of deionized water to the upper surface of wafer W, respectively.

Figure 7:
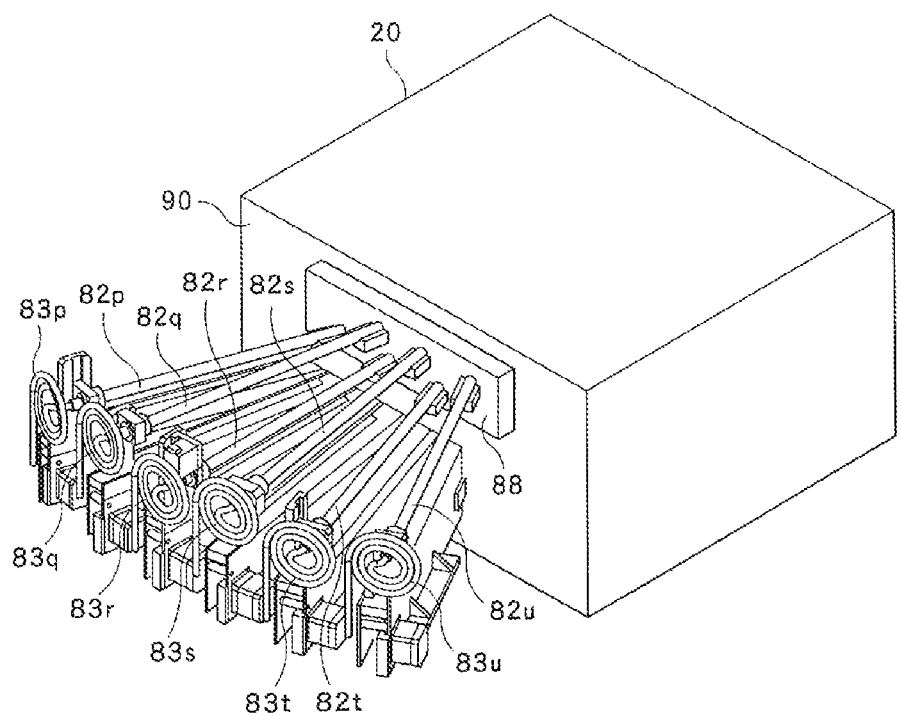
FIG. 7 is a perspective view illustrating a processing chamber and six nozzle supporting arms in the liquid processing apparatus as illustrated in, for example, FIG. 2.
Figure 8:
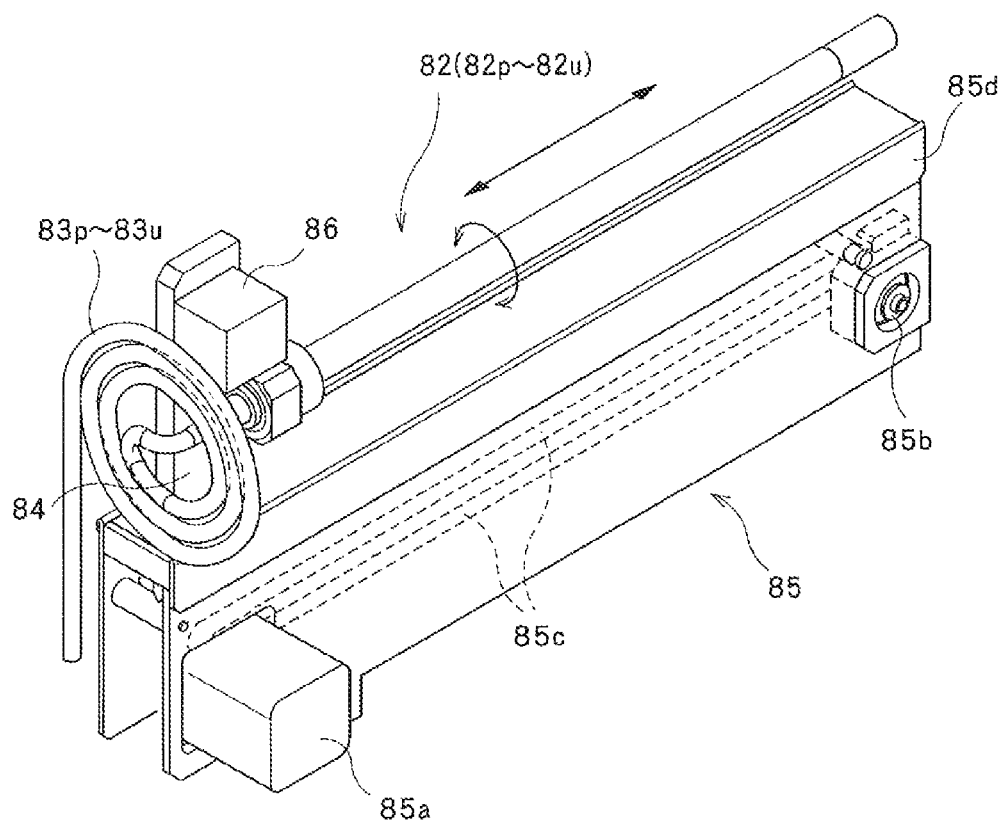
FIG. 8 is an enlarged perspective view of the nozzle supporting arms as illustrated in FIG. 7.
Figure 9:
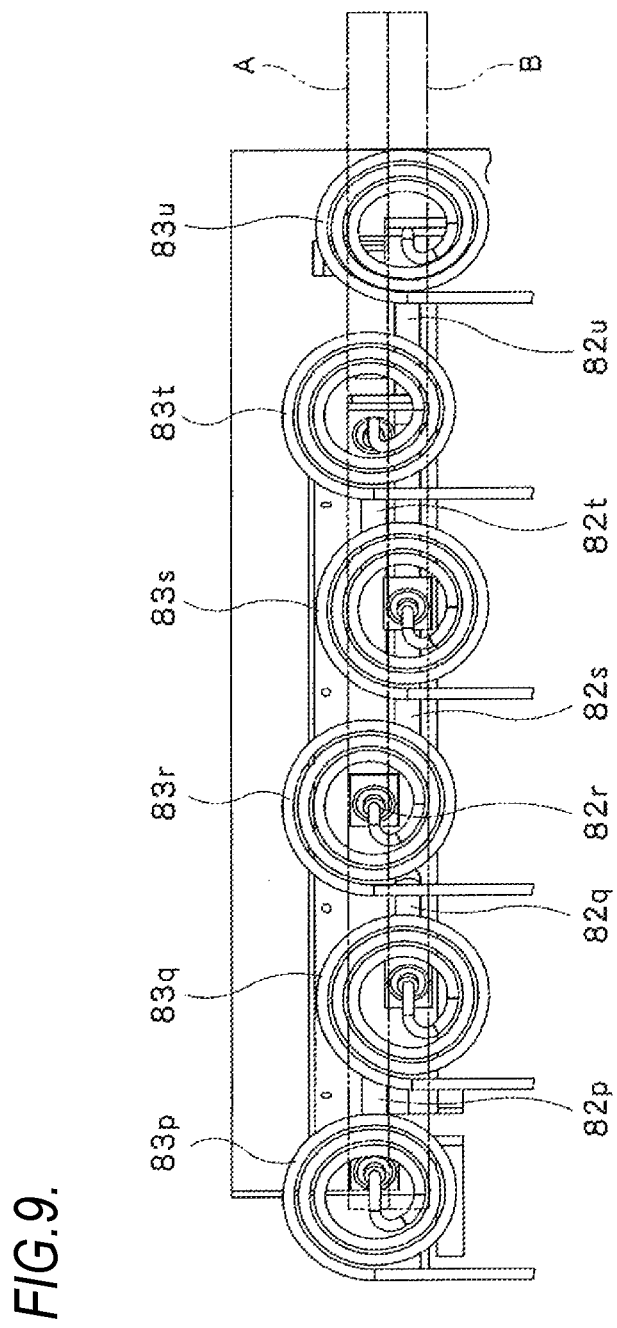
FIG. 9 is a view illustrating a configuration of the nozzle supporting arms as illustrated in, for example, FIG. 7 when viewed from rear sides of the nozzle supporting arms toward the processing chamber.
Figure 10:
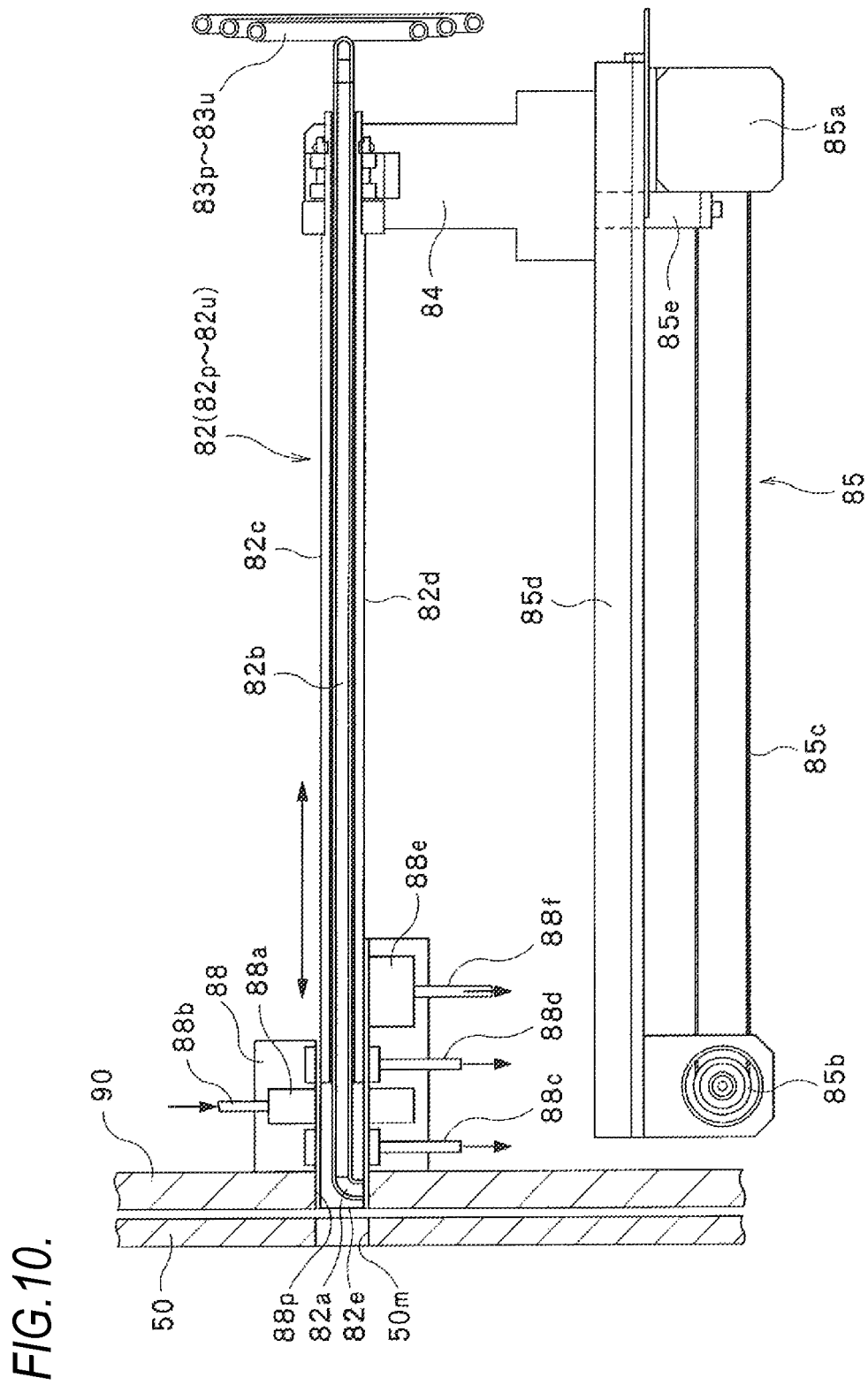
FIG. 10 is a lateral cross-sectional view illustrating the detailed configuration of the nozzle supporting arms as illustrated in, for example, FIG. 7.
Figure 11A:
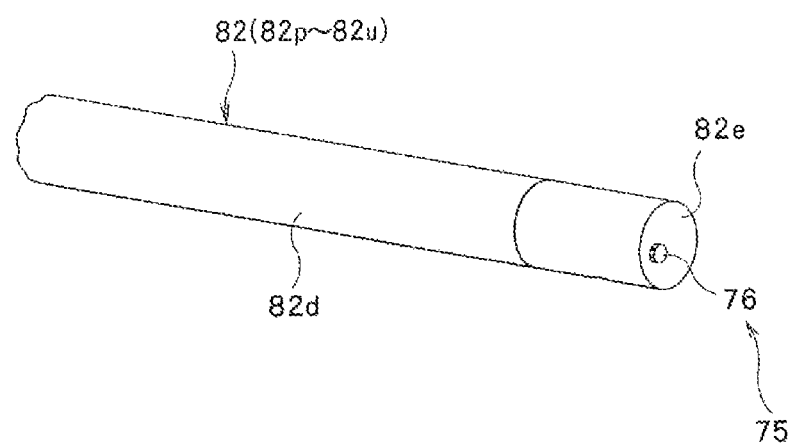
FIG. 11A is a view illustrating a state in which a gas ejection mechanism is installed in the nozzle supporting arm as illustrated in FIG. 7.
Figure 11B:
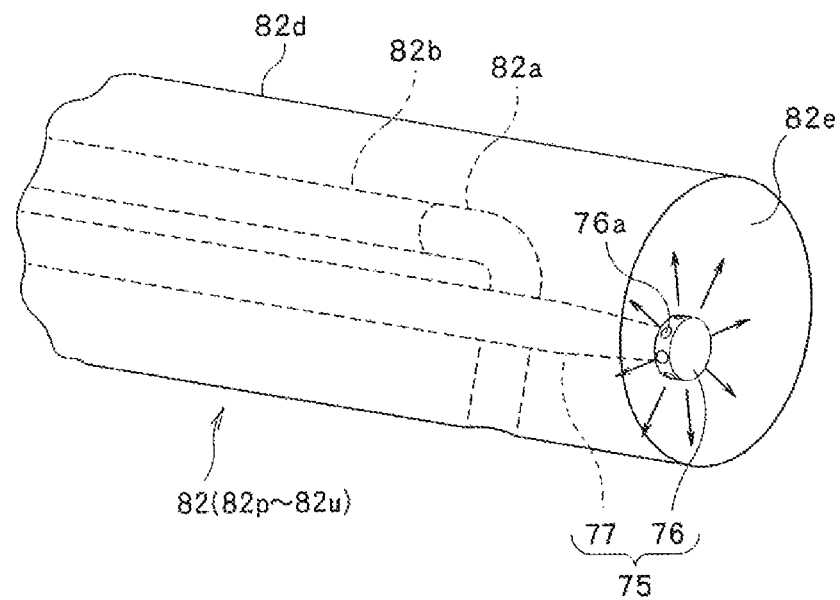
FIG. 11B is an enlarged view illustrating the gas ejection mechanism as illustrated in FIG. 11A.

Hereinafter, the configuration of nozzle supporting arms 82 in the exemplary embodiment will be described in detail with reference to FIGS. 7 to 11. Here, FIG. 7 is a perspective view illustrating processing chamber 20 and six nozzle supporting arms 82p to 82u in liquid processing apparatus 10 as illustrated in, for example, FIG. 2, and FIG. 8 is an enlarged perspective view of the respective nozzle supporting arms 82p to 82u as illustrated in FIG. 7. FIG. 9 is a view illustrating the configuration of the nozzle supporting arms 82p to 82u as illustrated in, for example, FIG. 7 when viewed from rear sides of nozzle supporting arms 82p to 82u toward processing chamber 20, and FIG. 10 is a lateral cross-sectional view illustrating the detailed configuration of nozzle supporting arms 82p to 82u. FIG. 11A is a perspective view illustrating a state in which a gas ejection mechanism, which will be described below, is installed in each of nozzle supporting arms 82p to 82u, and FIG. 11B is an enlarged perspective view illustrating the gas ejection mechanism as illustrated in FIG. 11A.

As illustrated in FIG. 7, six nozzle supporting arms 82 are constituted by, for example, deionized water supplying arm 82*p*, a first chemical liquid supplying arm 82*q*, an N₂ gas supplying arm 82*r*, a second chemical liquid supplying arm 82*s*, deionized water mist supplying arm 82*t* and an IPA supplying arm 82*u*. As described above, nozzles 82*a* are installed in the vicinity of the front ends of arms 82*p* to 82*u*. In this way, deionized water is supplied to an upper surface of wafer W from nozzle 82*a* installed in the vicinity of the front end of deionized water supplying arm 82*p*, a first chemical liquid (e.g., acid chemical liquid) is supplied to the upper surface of wafer W from nozzle 82*a* installed in the vicinity of the front end of first chemical liquid supplying arm 82*q*, and an N₂ gas is supplied to the upper surface of wafer W from nozzle 82*a* installed in the vicinity of the font end of N₂ gas supplying arm 82*r*. A second chemical liquid (e.g., alkaline chemical liquid) is supplied to the upper surface of wafer W from nozzle 82*a* installed in the vicinity of the front end of second chemical liquid supplying arm 82*s*, mist of deionized water is supplied to the upper surface of wafer W from nozzle 82*a* installed in the vicinity of the front end of deionized water mist supplying arm 82*t*, and IPA is supplied to the upper surface of wafer W from nozzle 82*a* installed in the vicinity of the front end of IPA supplying arm 82*u*.

As illustrated in FIGS. 8 and 10, an arm driving mechanism 85 for rectilinearly moving each of nozzle supporting arms 82 is installed at each of nozzle supporting arms 82. Arm driving mechanism 85 includes a motor 85*a* attached to a base member 85*d* to rotate forward and backward, a pulley 85*b* attached to base member 85*d* to face motor 85*a*, a circulation belt 85*c* wound around motor 85*a* and pulley 85*b*, and a belt attached member 85*e* attached to circulation belt 85*c*. Here, belt attached member 85*e* is attached to a lower portion of arm support part 84 which supports nozzle supporting arm 82, and belt attached member 85*e* and arm support part 84 integrally move. In arm driving mechanism 85, as motor 85*a* rotates, circulation belt 85*c* moves rightward or leftward in FIG. 10, and as belt attached member 85*e* attached to circulation belt 85*c* moves rightward or leftward in FIG. 10, arm support part 84 rectilinearly moves in a horizontal direction in FIG. 10. In this way, nozzle supporting arm 82 supported by arm support part 84 also rectilinearly moves in the horizontal direction in FIG. 10.

In liquid processing apparatus 10 of the exemplary embodiment, arm driving mechanism 85 is installed outside processing chamber 20, thereby preventing dusts generated from arm driving mechanism 85 from being introduced into processing chamber 20. Further, it is possible to prevent the atmosphere in processing chamber 20 from reaching arm driving mechanism 85.

As illustrated in FIG. 9, among the above-mentioned six arms 82*p* to 82*u*, deionized water supplying arm 82*p*, N₂ gas supplying arm 82*r* and deionized water mist supplying arm 82*t* are installed to have the same height. More specifically, in FIG. 9, arms 82*p*, 82*r* and 82*t* are installed to have the same height at a region surrounded by two-dotted chain line A in FIG. 9. Meanwhile, among the above-mentioned six arms 82*p* to 82*u*, first chemical liquid supplying arm 82*q*, second chemical liquid supplying arm 82*s* and IPA supplying arm 82*u* are also installed to have the same height. More specifically, in FIG. 9, arms 82*q*, 82*s* and 82*u* are installed to have the same height at a region surrounded by two-dotted chain line B in FIG. 9. As illustrated in FIG. 9, deionized water supplying arm 82*p*, N₂ gas supplying arm 82*r* and deionized water mist supplying arm 82*t* are installed at higher positions than first chemical liquid supplying arm 82*q*, second chemical liquid supplying arm 82*s* and IPA supplying arm 82*u*, respectively. This configuration prevents the plurality of arms 82*p* to 82*u* having different height levels from colliding with or interfering with each other when arms 82*p* to 82*u* are advanced into processing chamber 20 at the same time.

As illustrated in FIG. 10, each of arms 82*p* to 82*u* has a double pipe structure which is constituted by an inner pipe 82*b* and an outer pipe 82*c*. Inner pipe 82*b* communicates with nozzle 82*a*, and a fluid is sent from inner pipe 82*b* to nozzle 82*a*. Inner pipe 82*b* is made of, for example, fluorine resin. Inner pipe 82*b* is covered with outer pipe 82*c*, and outer pipe 82*c* is formed of, for example, a stainless steel pipe coated with fluorine resin.

As illustrated in FIG. 10, nozzle 82*a* of each of arms 82*p* to 82*u* is configured to supply a fluid to the upper surface of wafer W through a lateral surface 82*d* of each of arms 82*p* to 82*u*. Here, the lateral surface 82*d* refers to a surface which extends in the same direction as a longitudinal direction of each of arms 82*p* to 82*u* among surfaces of each of arms 82*p* to 82*u*.

As illustrated in, for example, FIG. 8, FIG. 10, spiral pipes 83*p* to 83*u* communicating with inner pipes 82*b* are installed outside arms 82*p* to 82*u* at rear end sides of arms 82*p* to 82*u*. Spiral pipes 83*p* to 83*u* are made of a flexible material such as a pipe made of fluorine resin. As illustrated in FIG. 7, FIG. 8 and FIG. 10, each of spiral pipes 83*p* to 83*u* is configured to have a spiral shape on a plane, e.g., a plane extending vertically, perpendicular to a direction where arms 82*p* to 82*u* extend when arms 82*p* to 82*u* corresponding to spiral pipes 83*p* to 83*u* are located at retreat positions. When the corresponding arms 82*p* to 82*u* are advanced into processing chamber 20, the shape of spiral pipe 83*p* to 83*u* is deformed to a conical spiral shape, e.g., spiral shape with a tapered front end. As a fluid such as a chemical liquid is sent to each of spiral pipes 83*p* to 83*u*, the fluid is ejected downward from nozzle 82*a* via inner pipe 82*b* installed within each of arms 82*p* to 82*u*.

In liquid processing apparatus 10 of the exemplary embodiment, each of arms 82*p* to 82*u* is rotatable about a longitudinal directional axis along a moving direction of each of arms 82*p* to 82*u*. Specifically, as illustrated in FIG. 8, a rotation mechanism 86 is installed at each of arms 82*p* to 82*u*, and each of arms 82*p* to 82*u* is rotated in an arrow direction in FIG. 8 by rotation mechanism 86. As each of arms 82*p* to 82*u* is rotated, a direction of nozzle 82*a* may be changed from a downward direction as illustrated in FIG. 10 to another direction. Since spiral pipes 83*p* to 83*u* are formed in the spiral shape and made of a flexible material, even when each of arms 82*p* to 82*u* is rotated by rotation mechanism 86, the shape of corresponding spiral pipe 83*p* to 83*u* may be smoothly changed according to the rotation of arm 82*p* to 82*u*, thereby preventing the rotation of arms 82*p* to 82*u* from being obstructed due to spiral pipes 83*p* to 83*u*.

When a fluid is supplied to wafer W held by holding unit 21 through nozzle 82*a*, rotation mechanism 86 selectively rotates arms 82*p* to 82*u* supporting nozzles 82*a* about the longitudinal directional axis. Specifically, when nozzle 82*a* approaches a peripheral edge of wafer W held by holding unit 21, arm 82*p* to 82*u* is rotated so that a direction of nozzle 82*a* is changed from the downward direction so as to be obliquely inclined. By doing this, a fluid is ejected at an angle by being obliquely and downwardly inclined from nozzle 82*a* on the peripheral edge of wafer W held by holding unit 21, which makes it possible to prevent the fluid supplied to wafer W from nozzle 82*a*, specifically, a liquid such as a chemical liquid from splattering on the peripheral edge of wafer W.

When each of arms 82*p* to 82*u* moves between an advance position and a retreat position, rotation mechanism 86 rotates each of arms 82*p* to 82*u* about the longitudinal directional axis so that nozzle 82*a* orients a direction other than the downward direction, for example, upward. As a result, it is possible to prevent the liquid such as the chemical liquid from dropping from nozzle 82a while arms 82p to 82u are moved.

As illustrated in FIGS. 7 and 10, arm cleaning units 88 for cleaning arms 82p to 82u are fixedly installed outside a wall 90 installed between processing chamber 20 and arm standby chamber 80 for every arm 82p to 82u. Arm cleaning units 88 are installed outside cup peripheral case 50 to clean the corresponding arms 82p to 82u when arms 82p to 82u move. A cleaning timing of each of arms 82p to 82u by each of arm cleaning units 88 may be freely set, and specifically, the cleaning of each of arms 82p to 82u is performed, for example, at every processing, once a day or once a month.

The detailed configuration of arm cleaning unit 88 will be described with reference to FIG. 10. As illustrated in FIG. 10, through holes through which nozzle supporting arms 82p to 82u pass are formed in arm cleaning units 88 to extend in a horizontal direction. A cross section of the through hole is slightly larger than that of nozzle supporting arm 82. A receiving part 88a in which a cleaning liquid is received is installed in the through hole. A cleaning liquid supply tube 88b is connected to receiving part 88a, and a cleaning liquid is supplied from cleaning liquid supply tube 88b to receiving part 88a. When the cleaning liquid is supplied to receiving part 88a, an outer circumferential surface of nozzle supporting arm 82 in receiving part 88a is covered with a liquid film. Nozzle supporting arm moves in arm cleaning unit 88 while a part of nozzle supporting arms 82p to 82u contacts the cleaning liquid received in receiving part 88a, thereby cleaning nozzle supporting arm 82.

In arm cleaning unit 88, suction mechanism 88c and 88d are installed at a front position which is closer to processing chamber 20 than receiving part 88a in a moving direction of nozzle supporting arm 82 (e.g., in a horizontal direction in FIG. 10) and at a rear position which is farther from processing chamber 20 than receiving part 88a, respectively. Suction mechanisms 88c and 88d absorb the cleaning liquid supplied to receiving part 88a to drain the liquid.

Suction mechanisms 88c and 88d absorb droplets which are attached to nozzle supporting arms 82 after nozzle supporting arm 82 is cleaned so as to dry the surface of nozzle supporting arm 82, particularly, the lateral surface 82d thereof.

In arm cleaning unit 88, a liquid draining part 88e for draining a liquid such as a chemical liquid which remains in inner pipe 82b of nozzle supporting arm 82 is installed behind receiving part 88a in a moving direction of nozzle supporting arm 82. A drain pipe 88f is connected to liquid draining part 88e, and the liquid sent to liquid draining part 88e is drained by drain pipe 88f. Nozzle supporting arm 82 moves so that nozzle 82a is located just above liquid draining part 88e, and the liquid such as the chemical liquid remaining in inner pipe 82b of nozzle supporting arm 82 is discharged to liquid draining part 88e from nozzle 82a. Since the liquid draining part 88e is installed, even when the liquid remains in inner pipe 82b of nozzle supporting arm 82 after liquid processing of wafer W is completed, the liquid remaining in inner pipe 82b may be drained from inner pipe in advance when the subsequent liquid processing is performed using nozzle 82a installed at nozzle supporting arm 82a. Particularly, when, for example, a high temperature chemical liquid is supplied to wafer W from nozzle 82a, the liquid remaining in inner pipe 82b of nozzle supporting arm 82 is cooled in many cases. Therefore, the cooled remaining liquid may be drained from inner pipe 82b in advance by liquid draining part 88e. Liquid draining part 88e may be installed in front of receiving part 88a instead of behind receiving part 88a in the moving direction of nozzle supporting arm 82.

In liquid processing apparatus 10 of the exemplary embodiment, arm cleaning unit 88 may be configured to clean the entire nozzle supporting arm 82 or only a part of nozzle supporting arm 82. Arm cleaning unit 88 is configured to clean the entire circumference of nozzle supporting arm 82, but is not particularly limited thereto.

In liquid processing apparatus 10 of the exemplary embodiment of the present disclosure, as illustrated in FIG. 2 or 10, each of arms 82p to 82u closes opening 88p of arm cleaning unit 88 of wall 90 installed between processing chamber 20 and arm standby chamber 80 when each of arms 82p to 82u standbys in arm standby chamber 80. By doing this, each of arms 82p to 82u may serve as a cover which closes opening 88p of arm cleaning unit 88 of wall 90 and isolate the region in processing chamber 20 from the region of arm standby chamber 80.

Each of arms 82p to 82u may also close opening 50m of outside cup peripheral case 50 which is located at the upper position as illustrated in FIG. 5. This makes it possible to isolate the region within outside cup peripheral case 50 from the region of arm standby chamber 80.

As illustrated in FIG. 11A, a gas ejection mechanism 75, which ejects a gas toward a surface of front end portion ("front end surface") 82e of each of nozzle supporting arms 82p to 82u, is installed at each of nozzle supporting arms 82p to 82u. Here, front end surface 82e refers to a surface which extends in a different direction from a longitudinal direction of each of arms 82p to 82u among surfaces of each of arms 82p to 82u and is positioned at a front end of each of arms 82p to 82u. In an example illustrated in FIG. 11B, front end surface 82e is formed of a flat surface extending in a direction perpendicular to a longitudinal directional axis of nozzle supporting arm 82. As described above, gas ejection mechanism 75 is provided on front end surface 82e of nozzle supporting arm 82, which makes it possible for nozzle supporting arm 82 to tightly close opening 88p of wall 90.

As illustrated in FIG. 11B, gas ejection mechanism 75 is formed to protrude from front end surface 82e of nozzle supporting arm 82, and includes a protrusion 76 having a gas ejection hole 76a for ejecting a gas and a gas supply pipe 77 which is installed within nozzle supporting arm 82 and supplies a gas to protrusion 76. As gas ejection mechanism 75 is installed at nozzle supporting arm 82, contaminants attached to front end surface 82e of nozzle supporting arm 82 may be removed by a gas, which will be described below.

An example of contaminants attached to front end surface 82e of nozzle supporting arm 82 may include droplets of the cleaning liquid which are attached to front end surface 82e at the time of cleaning by arm cleaning unit 88 and are not absorbed by suction mechanisms 88c and 88d of arm cleaning unit 88. It is also considered that the fluid supplied to the upper surface of wafer W from nozzle 82a of nozzle supporting arm 82 splatters from wafer W, and thus droplets of the fluid are attached to front end surface 82e as contaminants. It is also considered that when the high temperature chemical liquid is supplied to wafer W from nozzle 82a, steam generated from the high temperature chemical liquid is attached to front end surface 82e as contaminants.

The gas ejected toward the front end surface 82e of nozzle supporting arm 82 from gas ejection hole 76a of protrusion 76 is not particularly limited, and various gases capable of removing contaminants attached to front end surface 82e of nozzle supporting arm 82 such as air or $N_2$ gas may be used.

Two or more gas ejection holes 76a of protrusion 76 may be installed so that the gas is ejected in two or more different directions. For example, as illustrated in FIG. 11B, a plurality of, for example, eight gas ejection holes 76a are formed at different circumferential directional positions around a longitudinal directional axis of nozzle supporting arm 82. By doing this, the gas may be ejected along front end surface 82e radially with respect to protrusion 76 as indicated by an arrow in FIG. 11B. Therefore, it is possible to remove contaminants attached to front end surface 82e throughout front end surface 82e.

FIG. 11B illustrates an example in which ejection directions of the gas ejected from gas ejection holes 76a are substantially parallel with a direction where front end surface 82e of nozzle supporting arm 82 extends. However, the present disclosure is not limited thereto but the gas may be ejected from gas ejection holes 76a toward front end surface 82e so that a determined angle is formed between the ejection directions of the gas and the direction where front end surface 82e extends. In other words, the expression of "gas is ejected toward front end surface 82e" implies a case where the gas is ejected toward front end surface 82e at a predetermined angle as well as a case where the gas is ejected along front end surface 82e as well.

Next, the operation of liquid processing apparatus 10 configured as described above will be described.

First, lift pin plate 22 and processing liquid supplying pipe 28 in holding unit 21 are moved upward from the position illustrated in FIG. 4, and shutter 94 installed in opening 94a of processing chamber 20 has retreated from opening 94a to open opening 94a. Wafer W is carried from the outside of liquid processing apparatus 10 into processing chamber 20 through opening 94a by transfer arm 104 and disposed on lift pins 23 of lift pin plate 22. Thereafter, transfer arm 104 retreats from processing chamber 20. In this case, outside cup peripheral case 50 is located at the lower position as illustrated in FIG. 4. Nozzle supporting arms 82 are located at retreat positions of having retreated from processing chamber 20, respectively. That is, nozzle supporting arms 82 stand by in arm standby chamber 80. The gas such as clean air is sent from FFU 70 into processing chamber 20 in the down-flow mode at all times and discharged by exhaust unit 54, so that the atmosphere in processing chamber 20 is replaced.

Next, lift pin plate 22 and processing liquid supplying pipe 28 are moved downward to be located at the lower position illustrated in FIG. 4. In this case, holding members 25 installed at holding plate 26 support wafer W on lift pins 23 and dispose wafer W slightly to be spaced apart from lift pins 23.

Either after the lift pin plate is located at the lower position or while lift pin plate 22 is lowered, outside cup peripheral case 50 is moved upward by driving mechanisms 50b installed at outside cup peripheral case 50 so as to be located at the upper position as illustrated in FIG. 5. After outside cup peripheral case 50 is moved to the upper position, one or the plurality of nozzle supporting arms 82 among six nozzle supporting arms 82 standing by in arm standby chamber 80 advance into processing chamber 20 through opening 88p of arm cleaning unit 88 of wall 90 and opening 50m of outside cup peripheral case 50. See, for example, two-dotted chain line in FIG. 5. In this case, nozzle supporting arms 82 are moved rectilinearly by arm driving mechanism 85.

Next, holding plate 26 and lift pin plate 22 in holding unit 21 are rotated. By doing this, wafer W supported by each of holding members 25 of holding plate 26 is also rotated.

Thereafter, in a state as illustrated in FIG. 5, first chemical liquid supplying arm 82q and deionized water supplying arm 82p among six nozzle supporting arms 82 which stand by in arm standby chamber 80 advance into processing chamber 20 through opening 88p of arm cleaning unit 88 of wall 90 and opening 50m of outside cup peripheral case 50, simultaneously. In this case, since first chemical liquid supplying arm 82q and deionized water supplying arm 82p have the different height levels, arms 82q and 82p do not interfere with each other.

While wafer W is rotated, the acid chemical liquid is supplied to the upper surface of wafer W from nozzle 82a of first chemical liquid supplying arm 82q which has advanced into processing chamber 20. In this case, the acid chemical liquid may be supplied from processing liquid supplying pipe 28 toward the lower surface (back surface) of wafer W. The acid chemical liquid supplied to wafer W is sent to and recovered in, for example, first processing liquid recovering tank 46a among four processing liquid recovering tanks 46a, 46b, 46c and 46d. When the chemical liquid processing is performed as described above, deionized water supplying arm 82p stands by in processing chamber 20 so that nozzle 82a of deionized water supplying arm 82p is located at a position where deionized water is supplied.

After the acid chemical liquid is supplied to wafer W from nozzle 82a installed at first chemical liquid supplying arm 82q, deionized water is continuously supplied to wafer W from nozzle 82a installed at deionized water supplying arm 82p which stands by in processing chamber 20, thus performing rinsing. The deionized water supplied to wafer W is sent to and recovered in, for example, third processing liquid recovering tank 46c among four processing liquid recovering tanks 46a, 46b, 46c and 46d. In this case, since deionized water supplying arm 82p and first chemical liquid supplying arm 82q have different height levels in processing chamber 20, arms 82p and 82q do not interfere with each other.

When the processing of wafer W with the acid chemical liquid and the rinsing of wafer W are completed, first chemical liquid supplying arm 82q having advanced into processing chamber 20 retreats from processing chamber 20 and stands by in arm standby chamber 80. Meanwhile, deionized water supplying arm 82p is left in processing chamber 20. While the rinsing is performed, second chemical liquid supplying arm 82s advances into processing chamber 20 through opening 88p of arm cleaning unit 88 of wall 90 and opening 50m of outside cup peripheral case 50, and stands by in processing chamber 20 so that nozzle 82a of second chemical liquid supplying arm 82s is located at a position slightly retreated from a position where the deionized water is discharged by nozzle 82a of deionized water supplying arm 82p. In this case, since second chemical liquid supplying arm 82s and deionized water supplying arm 82p have different height levels, arms 82s and 82p do not interfere with each other.

Thereafter, while wafer W is being rotated, nozzle 82a of second chemical liquid supplying arm 82s having advanced into processing chamber 20 moves to a position where a second chemical liquid is supplied and supplies an alkaline chemical liquid to the upper surface of wafer W. In this case, the alkaline chemical liquid may be supplied from processing liquid supplying pipe 28 toward the lower surface (e.g., a back surface) of wafer W. The alkaline chemical liquid supplied to wafer W is sent to and recovered in, for example, second processing liquid recovering tank 46b among four processing liquid recovering tanks 46a, 46b, 46c and 46d. When the chemical liquid processing is performed as described above, deionized water supplying arm 82p stands by in processing chamber 20 so that nozzle 82a of deionized water supplying arm 82p is located at a position where the deionized water is supplied.

After the alkaline chemical liquid is supplied to wafer W from nozzle 82a installed at second chemical liquid supplying arm 82s, deionized water is continuously supplied to wafer W from nozzle 82a installed at deionized water supplying arm 82p which stands by in processing chamber 20, thus performing rinsing. The deionized water supplied to wafer W is sent to and recovered in, for example, third processing liquid recovering tank 46c among four processing liquid recovering tanks 46a, 46b, 46c and 46d.

When the processing of wafer W with the alkaline chemical liquid and the rinsing of wafer W are completed, second chemical liquid supplying arm 82s and deionized water supplying arm 82p having advanced into processing chamber 20 retreat from processing chamber 20 and stand by in arm standby chamber 80. While the rinsing is performed as described above, IPA supplying arm 82u advances into processing chamber 20 through opening 88p of arm cleaning unit 88 of wall 90 and opening 50m of outside cup peripheral case 50 and stands by at a position slightly retreated from a position where the deionized water is discharged by nozzle 82a of deionized water supplying arm 82p. $N_2$ gas supplying arm 82r advances into processing chamber 20 through opening 88p of arm cleaning unit 88 of wall 90 and opening 50m of outside cup peripheral case 50. Thus, $N_2$ gas supplying arm 82r and IPA supplying arm 82u are in an advanced state into processing chamber 20, respectively. In this case, since $N_2$ gas supplying arm 82r and IPA supplying arm 82u have different height levels, arms 82r and 82u do not interfere with each other.

Thereafter, while wafer W is being rotated, nozzle 82a installed at IPA supplying arm 82u moves to a position where IPA is supplied in processing chamber 20, and IPA is supplied to the center of wafer W. Then, IPA supplying arm 82u moves from the center of wafer W to a peripheral edge thereof, and IPA supplying arm 82u and $N_2$ gas supplying arm 82r are moved on wafer W so that a region of wafer W to which a gas is ejected by nozzle 82a installed at $N_2$ gas supplying arm 82r follows a region of wafer W to which IPA is supplied. By doing this, the $N_2$ gas is directly supplied to a place of the surface of wafer W where IPA is supplied, thereby properly performing drying of wafer W. The IPA supplied to wafer W is sent to and recovered in, for example, fourth processing liquid recovering tank 46d among four processing liquid recovering tanks 46a, 46b, 46c and 46d. When drying of wafer W is completed, IPA supplying arm 82u and $N_2$ gas supplying arm 82r, which have advanced into processing chamber 20, retreat from processing chamber 20 and stand by in arm standby chamber 80.

When the drying of wafer is completed, outside cup peripheral case 50 is moved downward by driving mechanisms 50b installed at outside cup peripheral case 50 so as to be located at the lower position as illustrated in FIG. 4.

Thereafter, lift pin plate 22 and processing supplying pipe 28 in holding unit 21 are moved upward from the position illustrated in FIG. 4. In this case, wafer W supported by holding member 25 of holding plate 26 is transferred to lift pin 23 of lift pin plate 22. Next, shutter 94 installed in opening 94a of processing chamber 20 is retreated from opening 94a to open opening 94a. Transfer arm 104 is advanced into processing chamber 20 through opening 94a from the outside of liquid processing apparatus 10, and wafer W on lift pin 23 of lift pin plate 22 is taken out by transfer arm 104. Wafer W taken out by transfer arm 104 is carried to the outside of liquid processing apparatus 10. Accordingly, a series of liquid processing of wafer W are completed.

Cleaning of each of nozzle supporting arms 82 may be performed by arm cleaning unit 88 when nozzle supporting arm 82 moves from processing chamber 20 to a position where the nozzle is retreated from processing chamber 20. The cleaning of each of nozzle supporting arms 82 may be performed after the respective processings are completed on wafer W. Alternatively, the cleaning may be performed periodically.

Here, according to liquid processing apparatus 10 of the exemplary embodiment of the present disclosure, arm cleaning unit 88 is fixedly installed at arm standby chamber 80, and arm cleaning unit 88 may clean nozzle supporting arm 82 when nozzle supporting arm 82 moves. In this way, as nozzle supporting arm 82 is cleaned by arm cleaning unit 88, nozzle supporting arm 82 may advance into processing chamber 20 while contaminants are not attached thereto, thereby preventing wafer W in processing chamber 20 from being contaminated due to contaminants attached to nozzle supporting arm 82. Since arm cleaning unit 88 is installed outside processing chamber 20, air flow in processing chamber 20 may be prevented from being unstable.

In liquid processing apparatus 10 of the exemplary embodiment, arm cleaning unit 88 includes receiving part 88a where the cleaning liquid is received, and in arm cleaning unit 88, nozzle supporting arm 82 moves while a part of nozzle supporting arm 82 contact the cleaning liquid received in receiving part 88a, thus performing cleaning of nozzle supporting arm 82. In this case, since nozzle supporting arm 82 may be cleaned by the cleaning liquid received in the fixed receiving part 88a without moving arm cleaning unit 88, a mechanism for cleaning arms may be simplified.

Meanwhile, in the exemplary embodiment, as illustrated in FIG. 10, suction mechanisms 88c and 88d of arm cleaning unit 88 are configured to absorb droplets which are attached to the surface of nozzle supporting arm 82 which is cleaned, from the lateral side. For this reason, it is considered that droplets attached to lateral surface 82d of nozzle supporting arm 82 among droplets attached to the surfaces of nozzle supporting arm 82 are sufficiently absorbed, but droplets attached to front end surface 82e of nozzle supporting arm 82 are not sufficiently absorbed.

Here, in the exemplary embodiment, as illustrated in FIGS. 11A and 11B, gas ejection mechanism 75, which ejects a gas toward front end surface 82e of nozzle supporting arm 82, is installed at nozzle supporting arm 82. By this configuration, even when contaminants such as droplets remain on front end surface 82e of nozzle supporting arm 82 after being cleaned by arm cleaning unit 88, the contaminants such as droplets may be successfully removed by the gas ejected from gas ejection mechanism 75. Therefore, it is possible to prevent wafer W in processing chamber 20 from being contaminated due to contaminants attached to front end surface 82e of nozzle supporting arm 82.

A timing when gas ejection mechanism 75 ejects a gas toward front end surface 82e of nozzle supporting arm 82 is not particularly limited, but for example, when nozzle supporting arm 82 is located at a retreat position where nozzle 82a has retreated from processing chamber 20, gas ejection mechanism 75 ejects the gas toward front end surface 82e. In this case, when front end surface 82e is located in the vicinity of suction mechanism 88c, gas ejection mechanism 75 may eject the gas toward front end surface 82e. By doing this, contaminants such as droplets blown from front end surface 82e by the gas may be absorbed by suction mechanism 88c. The expression of "Vicinity of suction mechanism 88c" implies a range where contaminants such as droplets blown from front end surface 82e by the gas are absorbed by suction mechanism 88c.

A performing procedures in which front end surface 82e reaches the vicinity of suction mechanism 88c as described above, is not particularly limited.

For example, after front end surface 82e moves to the vicinity of receiving part 88a and is cleaned by a cleaning liquid received in receiving part 88a, front end surface 82e may move to the vicinity of suction mechanism 88c, and gas ejection mechanism 75 may eject the gas toward front end surface 82e. In this case, droplets attached to front end surface 82e when front end surface 82e is located in the vicinity of suction mechanism 88c are droplets of the cleaning liquid supplied from receiving part 88a. During the performing procedures in which front end surface 82e moves to the vicinity of receiving part 88a, that is, the performing procedures in which nozzle supporting arm 82 moves to the retreat position, an outer circumferential surface such as lateral surface 82d of nozzle supporting arm 82 may be cleaned by the cleaning liquid from receiving part 88a.

Alternatively, after nozzle 82a and front end surface 82e advance into processing chamber 20 and nozzle 82a supplies a fluid such as a chemical liquid to wafer W, front end surface 82e may move to the vicinity of suction mechanism 88c, and gas ejection mechanism 75 may eject the gas toward front end surface 82e. In this case, droplets attached to front end surface 82e when front end surface 82e is located in the vicinity of suction mechanism 88c are droplets associated with the fluid supplied to wafer W from nozzle 82a.

When gas ejection mechanism 75 ejects the gas, outside cup peripheral case 50 may be located at the upper position. When outside cup peripheral case 50 is located at the upper position, the inside of outside cup peripheral case 50 is isolated from the outside, thereby preventing contaminants such as the gas ejected from gas ejection mechanism 75 or blown droplets from being introduced inside outside cup peripheral case 50. Since the atmosphere outside cup peripheral case 50 is discharged by exhaust unit 56, even though a flow such as the gas ejected from gas ejection mechanism 75 or blown droplets is discharged from arm standby chamber 80, the flow may be rapidly exhausted. The contaminants such as blown droplets may be received by cleaning unit 52 having storage part 52a which is positioned between wall 90 and cup 42.

In liquid processing apparatus 10 of the exemplary embodiment, nozzle supporting arm 82 includes inner pipe 82b for sending a fluid to nozzle 82a, and in arm cleaning unit 88, liquid draining part 88e for draining the liquid which remains in inner pipe 82b of nozzle supporting arm 82 is installed behind receiving part 88a in a moving direction of nozzle supporting arm 82. As nozzle supporting arm 82 moves so that nozzle 82a is located just above liquid draining part 88e, the liquid discharged from inner pipe 82b of nozzle supporting arm 82 is sent to liquid draining part 88e from nozzle 82a. By doing this, even when unnecessary liquid remains in inner pipe 82b of nozzle supporting arm 82 after the liquid processing of wafer W is completed, the liquid remaining in inner pipe 82b may be discharged from inner pipe 82b in advance when the subsequent liquid processing is performed using nozzle 82a installed at nozzle supporting arm 82a. Particularly, when, for example, a high temperature chemical liquid is supplied to wafer W from nozzle 82a, the liquid remaining in inner pipe 82b of nozzle supporting arm 82 is cooled in many cases. Therefore, the cooled remaining liquid may be discharged from inner pipe 82b in advance by liquid draining part 88e.

In liquid processing apparatus 10 of the exemplary embodiment, arm cleaning unit 88 is installed outside cup peripheral case 50. Therefore, it is possible to prevent an air flow in outside cup peripheral case 50 from being unstable due to arm cleaning unit 88.

The liquid processing apparatus according to the exemplary embodiment of the present disclosure is not limited to the above-described aspects, but may be modified in various ways. For example, it is not necessary to supply the processing liquid to both the upper surface and the lower surface of wafer W by nozzle 82a of nozzle supporting arm 82 having advanced into processing chamber 20 and processing liquid supplying pipe 28, but the processing liquid may be supplied to only the upper surface of wafer W by nozzle 82a of nozzle supporting arm 82.

A plurality of nozzles 82a may be installed at a single nozzle supporting arm 82.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A liquid processing apparatus, comprising:
   a processing chamber provided with a substrate holding unit holding a substrate and a cup disposed around the substrate holding unit;
   a nozzle configured to supply a fluid to the substrate held by the substrate holding unit;
   a nozzle supporting arm configured to support the nozzle; and
   a gas ejection mechanism installed at the nozzle supporting arm and having two or more gas ejection holes each configured to eject a gas toward a front end surface of the nozzle supporting arm, thereby removing contaminants attached to the front end surface of the nozzle supporting arm,
   wherein the nozzle is provided in a surface of the nozzle supporting arm that extends in a longitudinal direction of the nozzle supporting arm among surfaces of the nozzle supporting arm,
   the front end surface of the nozzle supporting arm extends in a different direction from the longitudinal direction of the nozzle supporting arm, and the gas ejection mechanism is provided in the front end surface of the nozzle supporting arm,
   the gas ejection mechanism includes a protrusion protruding from the front end surface of the nozzle supporting arm and a gas supply tube installed within the nozzle supporting arm, and
   the two or more gas ejection holes are provided around the protrusion, and the gas supply tube is configured to supply the gas to the protrusion.

2. The liquid processing apparatus of claim 1, wherein the two or more gas ejection holes of the protrusion are installed to eject the gas in two or more different directions.

3. The liquid processing apparatus of claim 1, wherein the nozzle is located at the side surface of the nozzle supporting arm, and a processing liquid supplying pipe is installed within the nozzle supporting arm.

4. The liquid processing apparatus of claim 1, further comprising:
   an arm standby chamber; and
   an arm driving mechanism configured to move the nozzle supporting arm in the arm standby chamber;
   wherein the nozzle supporting arm is moved by the arm driving mechanism between an advance position where the nozzle is inside of the processing chamber and a retreat position where the nozzle is outside of the processing chamber, and the as ejection mechanism ejects the as toward the front end surface of the nozzle supporting arm when the nozzle supporting arm is at the retreat position.

5. The liquid processing apparatus of claim 4, further comprising:

an arm cleaning unit configured to clean the nozzle supporting arm, wherein the arm cleaning unit is installed in a region between the cup and the arm standby chamber in the processing chamber, or at the arm standby chamber to be fixed.

6. The liquid processing apparatus of claim 5, wherein a wall extending in a vertical direction is installed between the processing chamber and the arm standby chamber, an opening through which the nozzle supporting arm passes is formed in the wall, and the arm cleaning unit is attached to the wall.

7. The liquid processing apparatus of claim 6, wherein the arm cleaning unit further includes a suction mechanism configured to absorb a liquid, and the gas ejection mechanism ejects the gas in the vicinity of the suction mechanism.

8. The liquid processing apparatus of claim 6, wherein when the nozzle supporting arm is located at the retreat position, the opening of the wall is closed by the front end surface of the nozzle supporting arm.

9. The liquid processing apparatus of claim 5, further comprising:

a cylindrical outside cup peripheral case disposed around the cup in the processing chamber, adapted to be elevatable/descendible between an upper position and a lower position, and having an opening through which the nozzle supporting arm passes, wherein the arm cleaning unit is installed outside of the outside cup peripheral case.

10. The liquid processing apparatus of claim 9, further comprising:

a wall installed between the processing chamber and the arm standby chamber, and extending in a vertical direction; and a cleaning unit for the outside cup peripheral case positioned below the outside cup peripheral case in the processing chamber and having a storage part for storing cleaning liquid for cleaning the outside cup peripheral case positioned between the wall and the cup.

* * * * *